(12) United States Patent
Lin et al.

(10) Patent No.: US 7,695,817 B2
(45) Date of Patent: Apr. 13, 2010

(54) THERMALLY CONDUCTIVE GREASE AND METHODS AND DEVICES IN WHICH SAID GREASE IS USED

(75) Inventors: Zuchen Lin, Midland, MI (US); Shizhong Zhang, Midland, MI (US); Mark Fisher, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 720 days.

(21) Appl. No.: 10/571,956

(22) PCT Filed: Sep. 16, 2004

(86) PCT No.: PCT/US2004/030818

§ 371 (c)(1), (2), (4) Date: Mar. 14, 2006

(87) PCT Pub. No.: WO2005/047378

PCT Pub. Date: May 26, 2005

(65) Prior Publication Data

US 2006/0292840 A1 Dec. 28, 2006

Related U.S. Application Data

(60) Provisional application No. 60/517,448, filed on Nov. 5, 2003.

(51) Int. Cl.
*B32B 25/20* (2006.01)
(52) U.S. Cl. ........................ 428/447; 524/588
(58) Field of Classification Search ............... 524/588; 428/447
See application file for complete search history.

(56) References Cited

U.S. PATENT DOCUMENTS

| | | | |
|---|---|---|---|
| 4,265,775 A | 5/1981 | Aakalu et al. |
| 5,011,870 A | 4/1991 | Peterson |
| 5,094,769 A | 3/1992 | Anderson et al. |
| 5,098,609 A | 3/1992 | Iruvanti et al. |
| 5,098,789 A | 3/1992 | DeKoven et al. |
| 5,100,568 A | 3/1992 | Takashashi et al. |
| 5,221,339 A | 6/1993 | Takahashi et al. |
| 5,227,081 A | 7/1993 | Sawa et al. |
| 5,591,789 A | 1/1997 | Iruvanti et al. |
| 5,981,641 A | 11/1999 | Takahashi et al. |
| 6,040,362 A | 3/2000 | Mine et al. |
| 6,114,413 A | 9/2000 | Kang et al. |
| 6,114,429 A | 9/2000 | Yamada et al. |
| 6,136,758 A | 10/2000 | Yamada et al. |
| 6,169,142 B1 | 1/2001 | Nakano et al. |
| 6,174,841 B1 | 1/2001 | Yamada et al. |
| 6,255,257 B1 | 7/2001 | Yamada et al. |
| 6,306,957 B1 | 10/2001 | Nakano et al. |
| 6,372,337 B2 | 4/2002 | Takahashi et al. |
| 6,689,721 B2 | 2/2004 | Denpo et al. |
| 6,844,393 B2 | 1/2005 | Goto et al. |
| 7,329,706 B2 * | 2/2008 | Fukui et al. .................. 524/588 |
| 2002/0018885 A1 | 2/2002 | Takahashi et al. |
| 2002/0124910 A1 | 9/2002 | Miyazaki et al. |
| 2003/0000690 A1 | 1/2003 | Chiu et al. |
| 2003/0168731 A1 | 9/2003 | Matayabas et al. |
| 2003/0195124 A1 | 10/2003 | Yamada et al. |
| 2003/0203188 A1 | 10/2003 | Bunyan |
| 2004/0092654 A1 | 5/2004 | Jennrich et al. |
| 2004/0097628 A1 | 5/2004 | Sekiba et al. |

FOREIGN PATENT DOCUMENTS

| | | |
|---|---|---|
| EP | 0 696 630 A2 | 2/1996 |
| EP | 0 939 115 A1 | 9/1999 |
| EP | 1 331 248 A2 | 7/2003 |
| JP | 05-156275 | 6/1993 |
| JP | 2001-002830 | 1/2001 |
| JP | 2002-030217 | 1/2002 |
| JP | 2004-010880 | 1/2004 |
| JP | 2004-210856 | 7/2004 |
| JP | 2005-054099 | 3/2005 |
| JP | 2005-170971 | 6/2005 |
| JP | 2007-291294 | 11/2007 |
| WO | WO 01/21393 A1 | 3/2001 |
| WO | WO 01/43146 A1 | 6/2001 |
| WO | WO 02/092693 A1 | 11/2002 |
| WO | WO 2004/041938 A1 | 5/2004 |

OTHER PUBLICATIONS

Freeman—Silicones, London Iliffe Book, Ltd. 1962, p. 27.*
JP 02-153995, published Jun. 13, 1990, Shin-Etsu Chemical Co. Ltd. Abstract only.
JP 59-179650, published Oct. 12, 1984, Nitto Electric Ind. Co. Ltd. Abstract only.
JP 62-043492, published Feb. 25, 1987, Toshiba Silicone Co. Ltd. Abstract only.
JP 62-043493, published Feb. 25, 1987, Toshiba Silicone Co. Ltd. Abstract only.

* cited by examiner

*Primary Examiner*—Kuo-Liang Peng
(74) *Attorney, Agent, or Firm*—Sharon K. Brady

(57) ABSTRACT

A thermally conductive grease includes (A) a polyorganosiloxane having a viscosity less than 50 cSt (mm$^2$/s) at 25° C. and (B) a thermally conductive filler. The thermally conductive grease is useful as a thermal interface material for electronic devices.

11 Claims, 1 Drawing Sheet

THERMALLY CONDUCTIVE GREASE AND METHODS AND DEVICES IN WHICH SAID GREASE IS USED

CROSS REFERENCE TO RELATED APPLICATIONS

This application is a U.S. national stage filing under 35 U.S.C. §371 of PCT Application No. PCT/US04/030818 filed on 16 Sep. 2004, currently pending, which claims the benefit of U.S. Provisional Patent Application No. 60/517,448 filed 5 Nov. 2003 under 35 U.S.C. §119 (e). PCT Application No. PCT/US04/030818 and U.S. Provisional Patent Application No. 60/517,448 are hereby incorporated by reference.

FIELD OF THE INVENTION

This invention relates to a thermally conductive grease ("grease"), methods for preparation and use of the grease, and devices containing the grease. More particularly, this invention relates to a grease comprising an organopolysiloxane having a viscosity less than 50 cSt (mm$^2$/s) at 25° C. and a thermally conductive filler. The grease may be used as a thermal interface material ("TIM").

BACKGROUND

Electronic components such as semiconductors, transistors, integrated circuits (ICs), discrete devices, and others known in the art are designed to operate at a normal operating temperature or within a normal operating temperature range. However, the operation of an electronic component generates heat. If sufficient heat is not removed, the electronic component will operate at a temperature significantly above its normal operating temperature. Excessive temperatures can adversely affect performance of the electronic component and operation of the device associated therewith and negatively impact mean time between failures.

To avoid these problems, heat can be removed by thermal conduction from the electronic component to a heat sink. The heat sink can then be cooled by any convenient means such as convection or radiation techniques. During thermal conduction, heat can be transferred from the electronic component to the heat sink by surface contact between the electronic component and the heat sink or by contact of the electronic component and heat sink with a TIM. The lower the thermal impedance of the medium, the greater the flow of heat from the electronic component to the heat sink.

Surfaces of the electronic component and the heat sink are typically not completely smooth, therefore, it is difficult to achieve full contact between the surfaces. Air spaces, which are poor thermal conductors, appear between the surfaces and increase impedance. These spaces can be filled by inserting a TIM between the surfaces. Therefore, there is a continuing need for suitable TIMs.

SUMMARY OF THE INVENTION

This invention relates to a thermally conductive grease comprising: (A) a polyorganosiloxane having a viscosity of less than 50 centiStokes (mm$^2$/s), and (B) a thermally conductive filler. This invention further relates to methods and devices in which the grease may be used.

DETAILED DESCRIPTION OF THE INVENTION

All amounts, ratios, and percentages are by weight unless otherwise indicated. The following is a list of definitions, as used herein.

Definitions and Usage of Terms

"A" and "an" each mean one or more.

"Bleed" means a tendency of siloxane species to migrate out of a grease onto a surface on which the grease is applied.

"Combination" means two or more items put together by any method.

The abbreviation "cSt" means centiStokes.

"Siloxane" and "silicone" are used synonymously herein.

"Substituted" means one or more hydrogen atoms bonded to a carbon atom has been replaced with another substituent.

"Surface treated" means that all, or a portion of, reactive groups on a particle have been rendered unreactive by any convenient chemical or unreactive means.

The abbreviation "W/mK" means Watts per meter Kelvin.

Composition

This invention relates to a grease comprising:
(A) 2 to 50% by weight of a polyorganosiloxane, where ingredient (A) has a viscosity of less than 50 centiStokes (mm$^2$/s), and ingredient (A) is free of hydroxyl groups, and
(B) 50 to 98% by weight of a thermally conductive filler, where the grease is free of silica.

Polyorganosiloxane

Ingredient (A) is a polyorganosiloxane having a viscosity of less than 50 cSt (mm$^2$/s), alternatively 1 to 47 cSt (mm$^2$/s). Ingredient (A) may be inert such that ingredient (A) does not react or increase in viscosity over time when used in the grease. Ingredient (A) may be free of reactive groups, such as hydroxyl groups. "Free of reactive groups" means that less than 0.01 wt% of the polyorganosiloxane species contain reactive groups. "Free of silica" means that the grease contains less silica than an amount sufficient to eliminate Bleed. Ingredient (A) may have a linear, branched, or cyclic structure. Ingredient (A) may be a single polyorganosiloxane or a combination comprising two or more polyorganosiloxanes that differ in at least one of the following properties: structure, viscosity, average molecular weight, siloxane units, and sequence.

Ingredient (A) may have the general formula: $R_m SiO_{(4-m)/2}$, where each R independently represents an organic group and m is 1.8 to 2.3. R is exemplified by substituted and unsubstituted monovalent hydrocarbon groups containing 1 to 30 carbon atoms, nitrogen containing groups, polyether containing groups, and epoxy containing groups. Examples of unsubstituted monovalent hydrocarbon groups include alkyl groups such as methyl, ethyl, propyl, butyl, pentyl, hexyl, heptyl, octyl, nonyl, and decyl and aromatic groups such as phenyl, tolyl, and xylyl. Examples of substituted monovalent hydrocarbon groups include halogenated hydrocarbon groups such as 3,3,3-trifluoropropyl and chloromethyl and cyanofunctional groups such as cyanoethyl and cyanopropyl.

Ingredient (A) may have a structure selected from:
(a) $R^1_3 SiO(R^1_2 SiO)_\alpha (R^1 R^2 SiO)_\beta SiR^1_3$,
(b) $R^3_2 R^4 SiO(R^3_2 SiO)_\chi (R^3 R^4 SiO)_\delta SiR^3_2 R^4$, or
(c) a combination thereof.

In the formulae above, each $R^1$ is independently a monovalent hydrocarbon group of 1 to 6 carbon atoms, alternatively 1 to 4 carbon atoms. Each $R^2$ is independently a monovalent hydrocarbon group of 1 to 30 carbon atoms, alternatively 1 to 10 carbon atoms. Each $R^3$ is independently a monovalent hydrocarbon group of 1 to 6 carbon atoms, alternatively 1 to 4 carbon atoms. Each $R^4$ is independently a monovalent hydrocarbon group of 1 to 30 carbon atoms, alternatively 1 to 10 carbon atoms. The subscripts $\alpha$, $\beta$, $\chi$ and $\delta$, have values such that the viscosity of ingredient (A) is less than 50 cSt (mm²/s) at 25° C.

Methods of preparing polyorganosiloxanes suitable for use as ingredient (A), such as hydrolysis and condensation of the corresponding organohalosilanes or equilibration of cyclic polydiorganosiloxanes, are well known in the art.

Thermally Conductive Filler

Ingredient (B) is a thermally conductive filler. The amount of ingredient (B) in the grease depends on various factors including the polyorganosiloxane selected for ingredient (A) and the filler selected for ingredient (B). The amount of ingredient (B) may be 50 to 98% based on the weight of the grease.

Ingredient (B) may be both thermally conductive and electrically conductive. Alternatively, ingredient (B) may be thermally conductive and electrically insulating. Suitable thermally conductive fillers for ingredient (B) include metal particles, metal oxide particles, and a combination thereof. Suitable thermally conductive fillers for ingredient (B) are exemplified by aluminum oxide; barium titanate; beryllium oxide; boron nitride; diamond; graphite; magnesium oxide; metal particulate such as copper, gold, nickel, and silver; silicon carbide; tungsten carbide; zinc oxide, and combinations thereof. Alternatively, ingredient (B) is exemplified by aluminum oxide, boron nitride, silicon carbide, zinc oxide, and combinations thereof. Alternatively, ingredient (B) may comprise a metal particle having a layer of conductive material (other than the metal) on its surface. For example, ingredient (B) may comprise a metal filler having a metal oxide layer on the surface of the filler, e.g., aluminum filler having an aluminum oxide layer on the surface of the aluminum filler. Due to the reactive nature of aluminum nitride, the grease may be free of aluminum nitride.

Thermally conductive fillers are known in the art and commercially available, see for example, U.S. Pat. No. 6,169,142 (col. 4, lines 7-33). For example, CB-A20S and Al-43-Me are aluminum oxide fillers of differing particle sizes commercially available from Showa-Denko, and AA-04, AA-2, and AA18 are aluminum oxide fillers commercially available from Sumitomo Chemical Company. Zinc oxide, such as zinc oxide 205XL is commercially available from U.S. Zinc.

Silver filler is commercially available from Metalor Technologies U.S.A. Corp. of Attleboro, Mass., U.S.A.

The shape of the thermally conductive filler particles is not specifically restricted, however, rounded or spherical particles may prevent viscosity increase to an undesirable level upon high loading of the thermally conductive filler in the grease.

Ingredient (B) may be a single thermally conductive filler or a combination of two or more thermally conductive fillers that differ in at least one of the following properties: particle shape, average particle size, and particle size distribution. For example, it may be desirable to combine a first aluminum oxide having a larger average particle size with a second aluminum oxide having a smaller average particle size in a proportion meeting the closest packing theory distribution curve. This improves packing efficiency and may reduce viscosity and enhance heat transfer. Alternatively, it may be desirable, for example, to combine an aluminum oxide having a larger average particle size with a zinc oxide having a smaller average particle size.

The average particle size of the thermally conductive filler will depend on various factors including the type of thermally conductive filler selected for ingredient (B) and the exact amount added to the grease, however, the thermally conductive filler may have an average particle size of 0.2 to 80 micrometers, alternatively 2 to 50 micrometers.

The thermally conductive filler for ingredient (B) may optionally be surface treated. Treating agents and treating methods are known in the art see for example, U.S. Pat. No. 6,169,142 (col. 4, line 42 to col. 5, line 2) and U.S. Pat. No. 6,136,758. The grease may comprise 0.05% to 10%, alternatively 0.05% to 5%, alternatively 0.05% to 0.5%, of a ingredient (C), a treating agent.

The treating agent may be an alkoxysilane having the formula: $R^5{}_x Si(OR^6)_{(4-x)}$, where x is 1, 2, or 3; alternatively x is 3. $R^5$ is a substituted or unsubstituted monovalent hydrocarbon group of 1 to 50 carbon atoms, alternatively 8 to 30 carbon atoms, alternatively 8 to 18 carbon atoms. $R^5$ is exemplified by alkyl groups such as hexyl, octyl, dodecyl, tetradecyl, hexadecyl, and octadecyl; and aromatic groups such as benzyl and phenylethyl. $R^5$ may be saturated or unsaturated, branched or unbranched, and unsubstituted. $R^5$ may be saturated, unbranched, and unsubstituted.

$R^6$ is an unsubstituted, saturated hydrocarbon group of 1 to 4 carbon atoms, alternatively 1 to 2 carbon atoms. Component C) is exemplified by hexyltrimethoxysilane, octyltriethoxysilane, decyltrimethoxysilane, dodecyltrimethyoxysilane, tetradecyltrimethoxysilane, phenylethyltrimethoxysilane, octadecyltrimethoxysilane, octadecyltriethoxysilane, and combinations thereof.

Alkoxy-functional oligosiloxanes may also be used as treating agents. Alkoxy-functional oligosiloxanes and methods for their preparation are known in the art, see for example, EP 1 101 167 A2. For example, suitable alkoxy-functional oligosiloxanes include those of the formula $(R^6O)_a Si(OSiR^7{}_2R^8)_{4-a}$. In this formula, a is 1, 2 or 3, alternatively a is 3. Each $R^6$ may be an alkyl group. Each $R^7$ is may be independently selected from unsaturated monovalent hydrocarbon groups of 1 to 10 carbon atoms. Each $R^8$ may be an unsaturated monovalent hydrocarbon group having at least 10 carbon atoms.

Metal fillers may be treated with alkylthiols such as octadecyl mercaptan; fatty acids such as oleic acid and stearic acid; and a combination thereof.

Treating agents for alumina include alkoxysilyl functional alkylmethyl polysiloxanes (e.g., partial hydrolysis condensate of $R^9{}_b R^{10}{}_c Si(OR^{11})_{(4-b-c)}$ or cohydrolysis condensates or mixtures), similar materials where the hydrolyzable group would be silazane, acyloxy or oximo. In all of these, a group tethered to Si, such as $R^9$ in the formula above, is a long chain unsaturated monovalent hydrocarbon or monovalent aromatic-functional hydrocarbon. $R^{10}$ is a monovalent hydrocarbon group, and $R^{11}$ is a monovalent hydrocarbon group of 1 to 4 carbon atoms. In the formula above, b is 1, 2, or 3 and c is 0, 1, or 2, with the proviso that b+c is 1, 2, or 3. One skilled in the art could optimize a specific treatment to aid dispersion of the filler without undue experimentation.

Other filler treating agents include alkenyl functional polyorganosiloxanes. Suitable alkenyl functional polyorganosiloxanes include, but are not limited to:

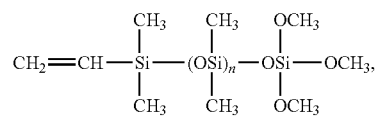

where n has a value up to 1,500.

Other Optional Ingredients

Optional ingredient (D) is an antioxidant. Ingredient (D) may comprise any antioxidant commonly used in plastics such as polypropylene. Ingredient (D) may be added to the grease in an amount of 0.001% to 1%.

Suitable antioxidants are known in the art and commercially available. Suitable antioxidants include phenolic antioxidants and combinations of phenolic antioxidants with stabilizers. Phenolic antioxidants include fully sterically hindered phenols and partially hindered phenols. Stabilizers include organophosphorous derivatives such as trivalent organophosphorous compound, phosphites, phosphonates, and a combination thereof; thiosynergists such as organosulfur compounds including sulfides, dialkyldithiocarbamate, dithiodipropionates, and a combination thereof; and sterically hindered amines such as tetramethyl-piperidine derivatives. Suitable antioxidants and stabilizers are disclosed in Zweifel, Hans, "Effect of Stabilization of Polypropylene During Processing and Its Influence on Long-Term Behavior under Thermal Stress," *Polymer Durability*, Ciba-Geigy AG, Additives Division, CH4002, Basel, Switzerland, American Chemical Society, vol. 25, pp. 375-396, 1996.

Suitable phenolic antioxidants include vitamin E and IRGANOX® 1010 from Ciba Specialty Chemicals, U.S.A. IRGANOX® 1010 comprises pentaerythriol tetrakis(3-(3,5-di-t-butyl-4-hydroxyphenyl)propionate).

Optional ingredient (E) is a vehicle such as a solvent or diluent. Ingredient (E) may be added during preparation of the grease, for example, to aid mixing and delivery. All or a portion of ingredient (E) may optionally be removed after the grease is prepared.

Optional ingredient (F) is a wetting agent. Suitable wetting agents include the anionic, cationic, and nonionic surfactants known in the art to act as wetting agents. Anionic wetting agents are exemplified by TERGITOL® No. 7, cationic wetting agents are exemplified by TRITON® X-100, and nonionic wetting agents are exemplified by TERGITOL® NR 27.

Optional ingredient (G) is an antifoaming agent

Optional ingredient (H) is a pigment. Examples of suitable pigments include Stan-Tone 50SP01 Green (which is commercially available from PolyOne) and carbon black such as Shawinigan Acetylene black, which is commercially available from Chevron Phillips Chemical Company LP.

Optional ingredient (I) is a flame retardant.

Optional ingredient (J) is a spacer. Spacers may comprise organic particles, inorganic particles, or a combination thereof. Spacers may be thermally conductive, electrically conductive, or both. Spacers may have a particle size of 25 micrometers to 250 micrometers. Spacers may comprise monodisperse beads. The amount of ingredient (J) depends on various factors including the distribution of particles, pressure to be applied during placement, and temperature during placement. The grease may contain up to 15%, alternatively up to 5% of ingredient (J) added in addition to, or instead of, a portion of ingredient (B).

Optional ingredient (K) is a low melting metal. Ingredient (K) may comprise Ga, In, Sn, or an alloy thereof. The low melting metal may optionally further comprise Ag, Bi, Cd, Cu, Pb, Zn, or a combination thereof. Examples of suitable low melting metals include Ga, In—Bi—Sn alloys, Sn—In—Zn alloys, Sn—In—Ag alloys, Sn—Ag—Bi alloys, Sn—Bi—Cu—Ag alloys, Sn—Ag—Cu—Sb alloys, Sn—Ag—Cu alloys, Sn—Ag alloys, Sn—Ag—Cu—Zn alloys, and combinations thereof. The low melting metal may have a melting point of up to 250° C., alternatively up to 225° C. The low melting metal may have a melting point of at least 50° C., alternatively at least 150° C. The low melting metal may be a eutectic alloy, a non-eutectic alloy, or a pure metal. Low melting metals are commercially available. The low melting metal may comprise 1% to 20% of the weight of the grease.

Method of Making

The grease described above may be made by mixing all ingredients at ambient or elevated temperature using any convenient mixing equipment, such as a centrifugal mixer (such as a mixer commercially available from Hauschild) or a resonant-sonic mixer (commercially available from Resodyn Corporation). When ingredient C) is present, the grease may optionally be prepared by surface treating ingredient B) and any other particulate ingredients with ingredient C) and thereafter mixing the resulting treated particulates with the other ingredients in the grease. Alternatively, ingredient C) may be mixed with some or all of the other ingredients simultaneously.

Method of Use

The grease described above may be used as a thermal interface material (TIM). The grease may be interposed along a thermal path between a heat source and a heat spreader or a heat sink. The grease may be interposed by any convenient means, such as wet-dispensing, screen printing, stencil printing, or solvent casting the grease.

The heat source may comprise an electronic component such as a semiconductor, a transistor, an integrated circuit, or a discrete device.

The heat spreader may comprise a thermally conductive plate, a thermally conductive cover, a fan, a circulating coolant system, or a combination thereof. The grease may be used in direct contact with the electronic component and the heat spreader (TIM1). The grease may be applied either to the electronic component and thereafter the heat spreader, or the grease may be applied to the heat spreader and thereafter to the electronic component. Alternatively, the grease may be used in direct contact with the heat spreader and a heat sink (TIM2). The grease may be applied either to the heat sink and thereafter the heat spreader, or the grease may be applied to the heat spreader and thereafter to the heat sink. Alternatively, the grease may be used in direct contact with the electronic component and the heat sink. The grease may be applied either to the electronic component and thereafter the heat sink, or the grease may be applied to the heat sink and thereafter to the electronic component.

This invention further relates to a product comprising:
a) an electronic component,
b) an interface material, and
c) a heat sink;
where the interface material is arranged along a thermal path extending from a surface of the electronic component to a surface of the heat sink, where the interface material comprises the grease described above.

This invention further relates to a product comprising:
a) a heat spreader, and
b) an interface material on a surface of the heat spreader,
where the interface material and the heat spreader are configured to comprise a portion of a thermally conductive path between an electronic component and a heat sink, and where the interface material comprises the grease described above.

The product may further comprise c) a heat sink, wherein the interface material contacts a surface of the heat sink. Alternatively, the interface material may contact the electronic component.

FIG. 1 shows a device 100 according to this invention. The device 100 comprises an electronic component (shown as an integrated circuit (IC) chip) 103 mounted to a substrate 104 through a die attach adhesive 109. The substrate 104 has solder balls 105 attached thereto through pads 110. A first interface material (TIM1) 106 is interposed between the IC chip 103 and a metal cover 107. The metal cover 107 acts as a heat spreader. A second interface material (TIM2) 102 is interposed between the metal cover 107 and a heat sink 101. Heat moves along a thermal path represented by arrows 108 when the device is operated.

EXAMPLES

These examples are intended to illustrate the invention to one skilled in the art and should not be interpreted as limiting the scope of the invention set forth in the claims. In the examples below, "Me" represents a methyl group.

Reference Example 1

Measurement of Bleed

Bleed is measured using the cone-mesh oil bleeding test, ASTM D6184, at 120° C. for two days.

Reference Example 2

Measurement of Bleed

The weight losses of grease samples are measured by a thermogravimetric analysis (TGA experiment). The grease is heated from 30° C. to 120° C. at 10° C./min and held at an isotherm for 24 hours under 10 ml/min $N_2$ flow.

Reference Example 3

Preparation of Polyorganosiloxane

A siloxane with an average structure $Me_3SiO(SiMe_2O)_3(SiHMeO)_6SiMe_3$ is reacted with 1-decene in the presence of $H_2PtCl_6$ catalyst. After the reaction, excess decenes and low molecular weight siloxanes are removed under reduced pressure at 150° C. Under a moderate reaction condition (not exceeding 140° C.), the SiH functional groups are partially converted to $SiC_{10}H_{21}$. The resulting polyorganosiloxane has a viscosity of 47 cSt (mm²/s) by a Cannon-Manning Semi-Micro viscometer at 25° C.

Example 1

Preparation of Grease

The polyorganosiloxane prepared in Reference Example 3 (4.8 g), $C_{18}H_{37}Si(OMe)_3$ (0.21 g), and IRGANOX® 1010 (0.04 g) are mixed with an $Al_2O_3$ and ZnO filler mixture (79.3 g). The filler mixture contains a 2:1 ratio of $Al_2O_3$:ZnO. The average particle size of $Al_2O_3$ is 10 micrometers, and the average particle size of ZnO is 1 micrometer. Mixing is performed with a Hauschild mixer. The resulting grease has a viscosity of 14,000 Poise at 0.5 s$^{-1}$ shear rate under a steady rate sweep experiment on an ARES Rheometer.

Bleed is measured on the grease according to the method of Reference Example 2. The TGA trace shows that 0.22% of the weight loss took place in the first 500 minutes, and weight then stays constant. The thermal conductivity of the grease is 3.5 W/mK according to the Mathis Hotdisk method.

Bleed is also measured according to the method of Reference Example 1, and no Bleed is observed. Bleed is measured by the method of Reference Example 1 again on the same sample, except that the temperature is increased to 150° C. for two days. Again, no Bleed is observed.

Example 2

Preparation of Grease

A polyorganosiloxane having a viscosity of 29.4 cSt (mm²/s) and the average structure:

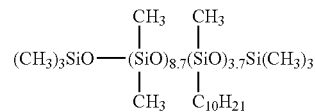

(8.4 g), $C_{18}H_{37}Si(OMe)_3$ (0.4 g), and IRGANOX® 1010 (0.07 g) are mixed with an $Al_2O_3$ and ZnO filler mixture (117.8 g). The filler mixture contains a 2.3:1 ratio of $Al_2O_3$:ZnO. The average particle size of $Al_2O_3$ is 10 micrometers, and the average particle size of ZnO is 1 micrometer. Mixing is performed with a Hauschild mixer. The resulting grease has a viscosity of 1133 Poise at 0.5 s$^{-1}$ shear rate under a steady rate sweep experiment on an AR2000 stress rheometer. The thermal conductivity of the grease measured by the Mathis Hotdisk method is 3.0 W/mK.

Example 3

Preparation of Grease

A polyorganosiloxane having a viscosity of 15 cSt (mm²/s) and the average structure:

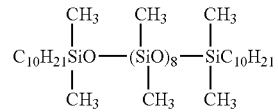

(8.4 g), $C_{18}H_{37}Si(OMe)_3$ (0.4 g), and IRGANOX® 1010 (0.07 g) are mixed with an $Al_2O_3$ and ZnO filler mixture (117.9 g). The filler mixture contains a 2.3:1 ratio of $Al_2O_3$:ZnO. The average particle size of $Al_2O_3$ is 10 micrometers, and the average particle size of ZnO is 1 micrometer. Mixing is performed with a Hauschild mixer. The grease has a viscosity of 1162 Poise at 0.5 s$^{-1}$ shear rate under a steady rate sweep experiment on an AR2000 stress rheometer. The thermal conductivity of the grease measured by the Mathis Hotdisk method is 3.0 W/mK.

Example 4

Preparation of Grease

A polyorganosiloxane having a viscosity of 22 cSt (mm²/s) and the average structure:

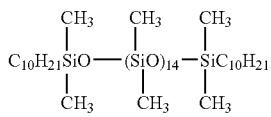

(8.4 g), C$_{18}$H$_{37}$Si(OMe)$_3$ (0.4 g), and IRGANOX® 1010 (0.07 g), are mixed with an Al$_2$O$_3$ and ZnO filler mixture (117.9 g). The filler mixture contains a 2.3:1 ratio of Al$_2$O$_3$:ZnO. The average particle size of Al$_2$O$_3$ is 10 micrometers, and the average particle size of ZnO is 1 micrometer. Mixing is performed with a Hauschild mixer. The grease has a viscosity of 2279 Poise at 0.5 s$^{-1}$ shear rate under a steady rate sweep experiment on an AR2000 stress rheometer. The thermal conductivity of the grease measured by the Mathis Hotdisk method is 3.2 W/mK.

Example 5

Preparation of Grease

A grease is prepared by mixing ingredients comprising: 5.4 weight parts trimethylsiloxy-terminated dimethyl, methyldecyl siloxane; 0.02 weight parts dimethylvinylsiloxy-terminated polydimethylsiloxane; 0.05 weight parts IRGANOX® 1010; 0.01 weight part carbon black; 66 weight parts alumina treated with mono-trimethoxysiloxy, mono(vinyl, methyl, or butyl)dimethylsiloxane; 28 weight parts zinc oxide; and 0.1 weight parts octadecyltrimethoxysilane.

INDUSTRIAL APPLICABILITY

The inventors surprisingly found that the use of a polyorganosiloxane having a viscosity less than 50 cSt (mm$^2$/s) at 25° C. yields a grease that exhibits little or no Bleed, even without the presence of a bleed inhibiting agent, such as silica, in the grease. "No Bleed" means that the grease does not exhibit Bleed when tested by the method of Reference Example 1. The grease may have thermal conductivity of 3 W/mK or greater. The grease is suitable for use as a thermal interface material in various electronic devices.

REFERENCE NUMERALS

Figure 1:
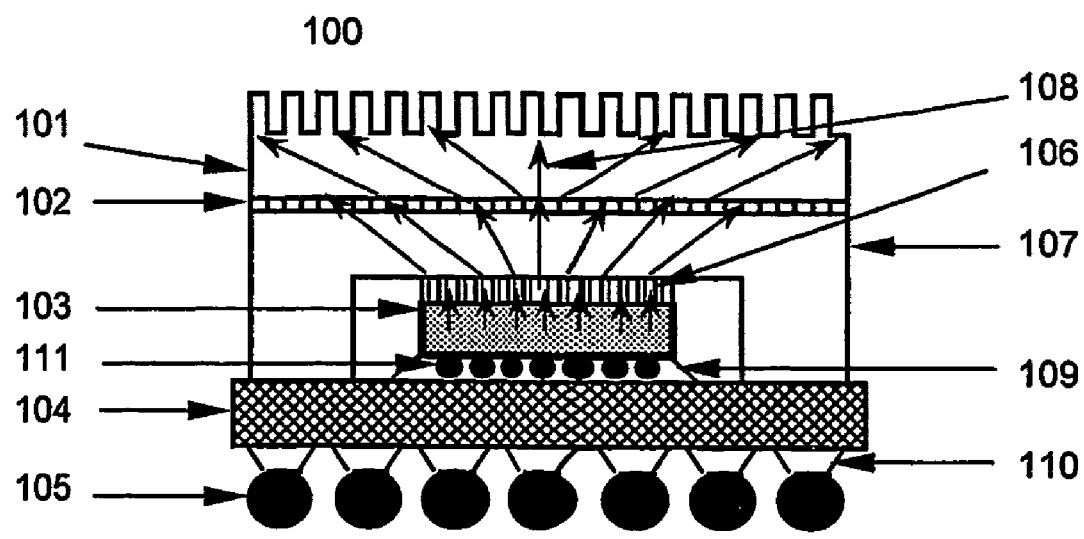
FIG. 1 is a schematic representation of a cross section of an electronic device including the grease of this invention.

100 device
101 heat sink
102 second interface material (TIM2)
103 integrated circuit (IC) chip
104 substrate
105 solder balls
106 first interface material (TIM1)
107 metal cover
108 thermal path represented by arrows
109 die attach adhesive
110 pads

The invention claimed is:

1. A grease comprising:
   (A) 2 to 50% by weight of a polyorganosiloxane having formula R$^1_3$SiO(R$^1_2$SiO)$_\alpha$(R$^1$R$^2$SiO)$_\beta$SiR$^1_3$, where
   each R$^1$ is independently a monovalent hydrocarbon group of 1 to 6 carbon atoms;
   each R$^2$ is independently a monovalent hydrocarbon group of 1 to 30 carbon atoms; and
   subscripts $\alpha$ and $\beta$ have values such that the viscosity of ingredient (A) is less than 50 mm$^2$/s at 25° C.;
   (B) 50 to 98% by weight of a thermally conductive filler comprising aluminum oxide and zinc oxide;
   (C) 0.05 to 10% by weight of an alkoxysilane having formula R$^5_x$Si(OR$^6$)$_{(4-x)}$, where
   x is 1, 2, or 3;
   R$^5$ is a substituted or unsubstituted monovalent hydrocarbon group of 1 to 50 carbon atoms; and
   R$^6$ is an unsubstituted, saturated hydrocarbon group of 1 to 4 carbon atoms;
   (D) 0.001 to 1% by weight of an antioxidant; and
   (E) 0.001 to 1% by weight of a pigment.

2. The grease of claim 1, where the polyorganosiloxane has a viscosity of 1 to 47 mm$^2$/s.

3. The grease of claim 1, further comprising at least one ingredient selected from the group consisting of: (C) a treating agent, (D) an antioxidant, (E) a vehicle, (F) a wetting agent, (G) an antifoaming agent, (H) a pigment, (I) a flame retardant, (J) a spacer, and (K) a low melting metal.

4. A method comprising: interposing the grease of claim 1 along a thermal path between a heat source and a heat spreader.

5. The method of claim 4, wherein the heat source comprises an electronic component.

6. The method of claim 4, where the heat spreader comprises a heat sink, a thermally conductive plate, a thermally conductive cover, a fan, or a circulating coolant system.

7. A device comprising:
   a) an electronic component,
   b) an interface material, and
   c) a heat sink;
   where the interface material is arranged along a thermal path extending from a surface of the electronic component to a surface of the heat sink, where the interface material comprises the grease of claim 1.

8. A device comprising:
   a) a heat spreader, and
   b) an interface material on a surface of the heat spreader,
   where the interface material and the heat spreader are configured to comprise a portion of a thermally conductive path between an electronic component and a heat sink, and where the interface material comprises the grease of claim 1.

9. The grease of claim 1, where the aluminum oxide has an average particle size of 10 micrometers and the zinc oxide has an average particle size of 1 micrometer.

10. The grease of claim 1, where the polyorganosiloxane is a trimethylsiloxy-terminated dimethyl, methyldecyl siloxane.

11. The grease of claim 1, where the polyorganosiloxane is a dimethyl, decylsiloxy-terminated dimethyl siloxane.

* * * * *